(12) United States Patent
Flynn et al.

(10) Patent No.: US 11,741,638 B2
(45) Date of Patent: Aug. 29, 2023

(54) METHODS AND DEVICES FOR ENTROPY CODING POINT CLOUDS

(71) Applicant: OT Patent Escrow, LLC, Chicago, IL (US)

(72) Inventors: David Flynn, Darmstadt (DE); Sébastien Lasserre, Thorigné-Fouillard (FR)

(73) Assignee: Malikie Innovations Limited, Dublin (IE)

( * ) Notice: Subject to any disclaimer, the term of this patent is extended or adjusted under 35 U.S.C. 154(b) by 0 days.

(21) Appl. No.: 17/889,476

(22) Filed: Aug. 17, 2022

(65) Prior Publication Data

US 2022/0392118 A1 Dec. 8, 2022

Related U.S. Application Data

(63) Continuation of application No. 16/955,513, filed as application No. PCT/CA2019/050039 on Jan. 10, 2019, now Pat. No. 11,455,749.

(30) Foreign Application Priority Data

Jan. 18, 2018 (EP) .................................. 18305037

(51) Int. Cl.
*G06T 9/40* (2006.01)
*G06F 17/18* (2006.01)
(Continued)

(52) U.S. Cl.
CPC .............. *G06T 9/40* (2013.01); *G06F 17/18* (2013.01); *G06T 9/001* (2013.01); *G06T 17/10* (2013.01);
(Continued)

(58) Field of Classification Search
CPC .......... G06T 9/40; G06T 9/001; G06T 17/10; G06T 9/005; G06T 9/00;
(Continued)

(56) References Cited

U.S. PATENT DOCUMENTS 8,942,282 B2 1/2015 Karczewicz et al.
9,111,333 B2 * 8/2015 Jiang .................... G06T 17/005
(Continued)

FOREIGN PATENT DOCUMENTS

CN 107403456 A 11/2017
JP 2017126890 A 7/2017
(Continued)

OTHER PUBLICATIONS

JPO: Japanese Office Action relating to JP application No. 2020-555094, dated Jan. 10, 2023.
(Continued)

*Primary Examiner* — Khai M Nguyen
(74) *Attorney, Agent, or Firm* — Botos Churchill IP Law LLP

(57) ABSTRACT

Methods and devices for encoding a point cloud. A current node associated with a sub-volume is split into further sub-volumes, each further sub-volume corresponding to a child node of the current node, and, at the encoder, an occupancy pattern is determined for the current node based on occupancy status of the child nodes. A probability distribution is selected from among a plurality of probability distributions based on occupancy data for a plurality of nodes neighbouring the current node. The encoder entropy encodes the occupancy pattern based on the selected probability distribution to produce encoded data for the bitstream and updates the selected probability distribution. The decoder makes the same selection based on occupancy data
(Continued)

for neighbouring nodes and entropy decodes the bitstream to reconstruct the occupancy pattern.

20 Claims, 16 Drawing Sheets

(51) Int. Cl.

| | | |
|---|---|---|
| *H03M 7/30* | (2006.01) | |
| *H04N 19/105* | (2014.01) | |
| *H04N 19/13* | (2014.01) | |
| *H04N 19/169* | (2014.01) | |
| *H04N 19/46* | (2014.01) | |
| *H04N 19/96* | (2014.01) | |
| *G06T 9/00* | (2006.01) | |
| *G06T 17/10* | (2006.01) | |

(52) U.S. Cl.
CPC ....... *H03M 7/6005* (2013.01); *H03M 7/6011* (2013.01); *H04N 19/105* (2014.11); *H04N 19/13* (2014.11); *H04N 19/1883* (2014.11); *H04N 19/46* (2014.11); *H04N 19/96* (2014.11)

(58) Field of Classification Search
CPC .......... G06T 2207/10028; G06F 17/18; H03M 7/6005; H03M 7/6011; H03M 7/405; H03M 7/40; H04N 19/105; H04N 19/13; H04N 19/1883; H04N 19/46; H04N 19/96; H04N 19/91
See application file for complete search history.

(56) References Cited

U.S. PATENT DOCUMENTS

| | | | |
|---|---|---|---|
| 11,010,928 | B2 | 5/2021 | Mammou et al. |
| 11,308,651 | B2 | 4/2022 | Hur et al. |
| 2003/0214502 | A1 | 11/2003 | Park et al. |
| 2011/0310976 | A1 | 12/2011 | Wang et al. |
| 2014/0184430 | A1 | 7/2014 | Jiang et al. |
| 2014/0303944 | A1 | 10/2014 | Jiang et al. |
| 2015/0010056 | A1 | 1/2015 | Choi et al. |
| 2017/0214943 | A1 | 7/2017 | Cohen et al. |
| 2017/0347100 | A1 | 11/2017 | Chou et al. |
| 2018/0137224 | A1* | 5/2018 | Hemmer .................. G06T 9/00 |
| 2019/0080483 | A1 | 3/2019 | Mammou et al. |

FOREIGN PATENT DOCUMENTS

| | | |
|---|---|---|
| KR | 100446635 B1 | 9/2004 |
| KR | 20130010124 A | 1/2013 |
| KR | 20140089426 A | 7/2014 |
| WO | WO2013067673 | 5/2013 |
| WO | 2013065702 A1 | 10/2013 |
| WO | 2018059946 A1 | 4/2018 |
| WO | 2019146691 A1 | 1/2019 |

OTHER PUBLICATIONS

European Office Action, EP Application No. 18 305 037.6 dated Mar. 11, 2021.
EP Office Action, Application No. 18290112.4 dated Mar. 11, 2021.
EPO: Extended European Search Report relating to EP application No. 21192137.4, dated Dec. 8, 2021.
Lassere S et al.: "[PCC] Neighbour-dependent entropy coding of occupancy pattersn in TMC3", 121. MPEG Meeting, XP030070580, dated Jan. 21, 2018.
Madhukar Budagavi: "Occupancy map coding simplification in PCC TMC2", 121. MPEG Meeting, XP030070514, dated Jan. 17, 2018.
"PCC Core Experiments for Category 3" 121. MPEG Meeting, XP030023994, dated Apr. 3, 2018.
"PCC Test Model Category 3 v1" 121. MPEG Meeting, XP030023996, dated Apr. 16, 2018.
Lassere S et al: "[PCC} A binary entropy coder for geometry coding in TM3" 122. MPEG Meeting, XP030070861, dated Apr. 11, 2018.
Armin Hornung et al: "OctoMap: an efficient probabilistic 3D mapping framework based on octrees", Autonomous Robots, vol. 34, No. 3, Feb. 7, 2013 (Feb. 7, 2013).
Jingliang Peng et al: "Geometry-guided progressive lossless 3D mesh coding wih octree (OT) decomposition", Jul. 1, 2005; Jul. 31, 2005-Aug. 4, 2005, Jul. 1, 2005 (Jul. 1, 2005).
EPO—Extened European Search Report relating to EP Application No. 2195127.2 dated Jan. 12, 2021.
U.S. Office Action, U.S. Appl. No. 17/045,771 dated May 12, 2022.
Zakharchenko et al.: "PCC Core Experiments for Category 3" 121. MPEG Meeting, XP030023994, dated Apr. 3, 2018.
Mammou: "PCC Test Model Category 3 v1" 121. MPEG Meeting, XP030023996, dated Apr. 16, 2018.
U.S. Notice of Allowance, U.S. Appl. No. 16/955,513, dated May 19, 2022.
Office Action issued in corresponding Korean Patent Application No. 10-2020-7023063, dated Apr. 27, 2023, 5 pages.
First Office Action for Chinese Patent Application No. 201980009159.0, dated May 5, 2023, 15 pages.
The Extended European Search Report for European Patent Application No. 23160508.0, dated Jun. 15, 2023, 11 Pages.

\* cited by examiner ately tree structure for coding;

METHODS AND DEVICES FOR ENTROPY CODING POINT CLOUDS

FIELD

The present application generally relates to point cloud compression and, in particular to methods and devices for improved entropy coding of point clouds.

BACKGROUND

Data compression is used in communications and computer networking to store, transmit, and reproduce information efficiently. There is an increasing interest in representations of three-dimensional objects or spaces, which can involve large datasets and for which efficient and effective compression would be highly useful and valued. In some cases, three-dimensional objects or spaces may be represented using a point cloud, which is a set of points each having a three coordinate location (X, Y, Z) and, in some cases, other attributes like colour data (e.g. luminance and chrominance), transparency, reflectance, normal vector, etc. Point clouds can be static (a stationary object or a snapshot of an environment/object at a single point in time) or dynamic (a time-ordered sequence of point clouds).

Example applications for point clouds include topography and mapping applications. Autonomous vehicle and other machine-vision applications may rely on point cloud sensor data in the form of 3D scans of an environment, such as from a LiDAR scanner. Virtual reality simulations may rely on point clouds.

It will be appreciated that point clouds can involve large quantities of data and compressing (encoding and decoding) that data quickly and accurately is of significant interest. Accordingly, it would be advantageous to provide for methods and devices that more efficiently and/or effectively compress data for point clouds.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
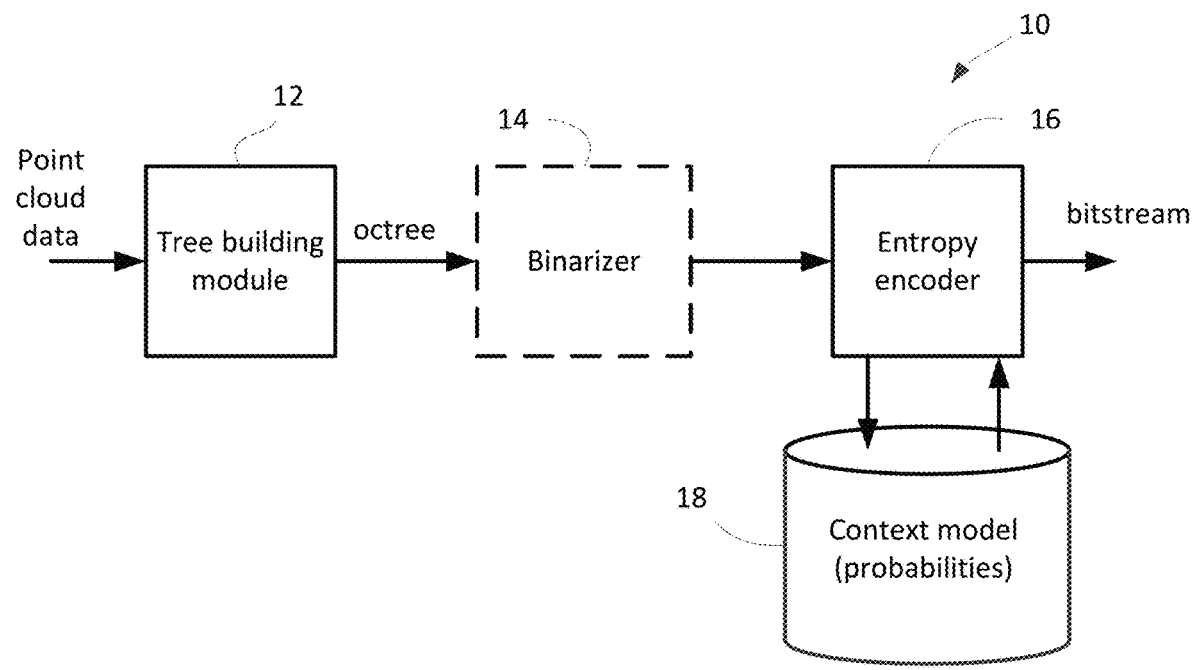
FIG. 1 shows a simplified block diagram of an example point cloud encoder.

The present application describes methods of encoding and decoding point clouds, and encoders and decoders for encoding and decoding point clouds. A current node associated with a sub-volume is split into further sub-volumes, each further sub-volume corresponding to a child node of the current node, and, at the encoder, an occupancy pattern is determined for the current node based on occupancy status of the child nodes. A probability distribution is selected from among a plurality of probability distributions based on occupancy data for a plurality of nodes neighbouring the current node. The encoder entropy encodes the occupancy pattern based on the selected probability distribution to produce encoded data for the bitstream and updates the selected probability distribution. The decoder makes the same selection based on occupancy data for neighbouring nodes and entropy decodes the bitstream to reconstruct the occupancy pattern.

In one aspect, the present application describes a method of encoding a point cloud to generate a bitstream of compressed point cloud data, the point cloud being defined in a tree structure having a plurality of nodes having parent-child relationships and that represent the geometry of a volumetric space recursively split into sub-volumes and containing the points of the point cloud. The method includes, for a current node associated with a sub-volume split into further sub-volumes, each further sub-volume corresponding to a child node of the current node, determining an occupancy pattern for the current node based on occupancy status of the child nodes; selecting a probability distribution from among a plurality of probability distributions, wherein the selecting is based on occupancy data for a plurality of nodes neighbouring the current node; entropy encoding the occupancy pattern based on the selected probability distribution to produce encoded data for the bitstream; and updating the selected probability distribution based on the occupancy pattern.

In another aspect, the present application describes a method of decoding a bitstream of compressed point cloud data to produce a reconstructed point cloud, the point cloud being defined in a tree structure having a plurality of nodes having parent-child relationships and that represent the geometry of a volumetric space recursively split into sub-volumes and containing the points of the point cloud. The method including, for a current node associated with a sub-volume split into further sub-volumes, each further sub-volume corresponding to a child node of the current node, selecting a probability distribution from among a plurality of probability distributions, wherein the selecting is based on occupancy data for a plurality of nodes neighbouring the current node; entropy decoding the bitstream based on the selected probability distribution to produce a reconstructed occupancy pattern for the current node signaling occupancy of the child nodes; and updating the selected probability distribution based on the reconstructed occupancy pattern.

In some implementations, the occupancy data is a pattern of occupancy for a parent node to the current node, and the plurality of nodes include sibling nodes to the current node that share the same the parent node.

In some implementations, the neighboring nodes are nodes that are associated with respective sub-volumes that share at least one face with the sub-volume associated with the current node. In further implementations, the neighboring nodes are nodes that are associated with respective sub-volumes that share at least one edge with the sub-volume associated with the current node. In yet further implementations, the neighboring nodes are nodes that are associated with respective sub-volumes that share at least one vertex with the sub-volume associated with the current node.

In some implementations, the plurality of probability distributions include a respective distribution associated with each of a plurality of patterns of occupancy of the plurality of nodes neighbouring the current node. In some cases, the respective distributions includes distributions associated with patterns of occupancy that include fully occupied, horizontally-oriented, vertically-oriented, and sparsely populated.

In some implementations, the encoding method further includes determining that none of the plurality of nodes neighbouring the current node are occupied, determining that more than one of the child nodes is occupied, and encoding a flag indicating that more than one of the child nodes is occupied.

In a further aspect, the present application describes encoders and decoders configured to implement such methods of encoding and decoding.

In yet a further aspect, the present application describes non-transitory computer-readable media storing computer-executable program instructions which, when executed, cause one or more processors to perform the described methods of encoding and/or decoding.

In yet another aspect, the present application describes a computer-readable signal containing program instructions which, when executed by a computer, cause the computer to perform the described methods of encoding and/or decoding.

Other aspects and features of the present application will be understood by those of ordinary skill in the art from a review of the following description of examples in conjunction with the accompanying figures.

At times in the description below, the terms "node" and "sub-volume" may be used interchangeably. It will be appreciated that a node is associated with a sub-volume. The node is a particular point on the tree that may be an internal node or a leaf node. The sub-volume is the bounded physical space that the node represents. The term "volume" may be used to refer to the largest bounded space defined for containing the point cloud. The volume is recursively divided into sub-volumes for the purpose of building out a tree-structure of interconnected nodes for coding the point cloud data.

In the present application, the term "and/or" is intended to cover all possible combinations and sub-combinations of the listed elements, including any one of the listed elements alone, any sub-combination, or all of the elements, and without necessarily excluding additional elements.

In the present application, the phrase "at least one of . . . or . . . " is intended to cover any one or more of the listed elements, including any one of the listed elements alone, any sub-combination, or all of the elements, without necessarily excluding any additional elements, and without necessarily requiring all of the elements.

A point cloud is a set of points in a three-dimensional coordinate system. The points are often intended to represent the external surface of one or more objects. Each point has a location (position) in the three-dimensional coordinate system. The position may be represented by three coordinates (X, Y, Z), which can be Cartesian or any other coordinate system. The points may have other associated attributes, such as colour, which may also be a three component value in some cases, such as R, G, B or Y, Cb, Cr. Other associated attributes may include transparency, reflectance, a normal vector, etc., depending on the desired application for the point cloud data.

Point clouds can be static or dynamic. For example, a detailed scan or mapping of an object or topography may be static point cloud data. The LiDAR-based scanning of an environment for machine-vision purposes may be dynamic in that the point cloud (at least potentially) changes over time, e.g. with each successive scan of a volume. The dynamic point cloud is therefore a time-ordered sequence of point clouds.

Point cloud data may be used in a number of applications, including conservation (scanning of historical or cultural objects), mapping, machine vision (such as autonomous or semi-autonomous cars), and virtual reality system, to give some examples. Dynamic point cloud data for applications like machine vision can be quite different from static point cloud data like that for conservation purposes. Automotive vision, for example, typically involves relatively small resolution, non-coloured, highly dynamic point clouds obtained through LiDAR (or similar) sensors with a high frequency of capture. The objective of such point clouds is not for human consumption or viewing but rather for machine object detection/classification in a decision process. As an example, typical LiDAR frames contain on the order of tens of thousands of points, whereas high quality virtual reality applications require several millions of points. It may be expected that there will be a demand for higher resolution data over time as computational speed increases and new applications are found.

While point cloud data is useful, a lack of effective and efficient compression, i.e. encoding and decoding processes, may hamper adoption and deployment.

One of the more common mechanisms for coding point cloud data is through using tree-based structures. In a tree-based structure, the bounding three-dimensional volume for the point cloud is recursively divided into sub-volumes. Nodes of the tree correspond to sub-volumes. The decision of whether or not to further divide a sub-volume may be based on resolution of the tree and/or whether there are any points contained in the sub-volume. A leaf node may have an occupancy flag that indicates whether its associated sub-volume contains a point or not. Splitting flags may signal whether a node has child nodes (i.e. whether a current volume has been further split into sub-volumes). These flags may be entropy coded in some cases and in some cases predictive coding may be used.

A commonly-used tree structure is an octree. In this structure, the volumes/sub-volumes are all cubes and each split of a sub-volume results in eight further sub-volumes/sub-cubes. Another commonly-used tree structure is a KD-tree, in which a volume (cube or rectangular cuboid) is recursively divided in two by a plane orthogonal to one of the axes. Octrees are a special case of KD-trees, where the volume is divided by three planes, each being orthogonal to one of the three axes. Both these examples relate to cubes or rectangular cuboids; however, the present application is not restricted to such tree structures and the volumes and sub-volumes may have other shapes in some applications. The partitioning of a volume is not necessarily into two sub-volumes (KD-tree) or eight sub-volumes (octree), but could involve other partitions, including division into non-rectangular shapes or involving non-adjacent sub-volumes.

The present application may refer to octrees for ease of explanation and because they are a popular candidate tree structure for automotive applications, but it will be understood that the methods and devices described herein may be implemented using other tree structures.

Reference is now made to FIG. 1, which shows a simplified block diagram of a point cloud encoder 10 in accordance with aspects of the present application. The point cloud encoder 10 includes a tree building module 12 for receiving point cloud data and producing a tree (in this example, an octree) representing the geometry of the volumetric space containing point cloud and indicating the location or position of points from the point cloud in that geometry.

The basic process for creating an octree to code a point cloud may include:
1. Start with a bounding volume (cube) containing the point cloud in a coordinate system
2. Split the volume into 8 sub-volumes (eight sub-cubes)
3. For each sub-volume, mark the sub-volume with 0 if the sub-volume is empty, or with 1 if there is at least one point in it
4. For all sub-volumes marked with 1, repeat (2) to split those sub-volumes, until a maximum depth of splitting is reached
5. For all leaf sub-volumes (sub-cubes) of maximum depth, mark the leaf cube with 1 if it is non-empty, 0 otherwise The above process might be described as an occupancy-equals-splitting process, where splitting implies occupancy, with the constraint that there is a maximum depth or resolution beyond which no further splitting will occur. In this case, a single flag signals whether a node is split and hence whether it is occupied by at least one point, and vice versa. At the maximum depth, the flag signals occupancy, with no further splitting possible.

In some implementations, splitting and occupancy are independent such that a node may be occupied and may or may not be split. There are two variations of this implementation:
1. Split-then-occupied. A signal flag indicates whether a node is split. If split, then the node must contain a point—that is splitting implies occupancy. Otherwise, if the node is not to be split then a further occupancy flag signals whether the node contains at least one point. Accordingly, when a node is not further split, i.e. it is a leaf node, the leaf node must have an associated occupancy flag to indicate whether it contains any points.
2. Occupied-then-split. A single flag indicates whether the node is occupied. If not occupied, then no splitting occurs. If it is occupied, then a splitting flag is coded to indicate whether the node is further split or not.

Irrespective of which of the above-described processes is used to build the tree, it may be traversed in a pre-defined order (breadth-first or depth-first, and in accordance with a scan pattern/order within each divided sub-volume) to produce a sequence of bits from the flags (occupancy and/or splitting flags). This may be termed the serialization or binarization of the tree. As shown in FIG. 1, in this example, the point cloud encoder 10 includes a binarizer 14 for binarizing the octree to produce a bitstream of binarized data representing the tree.

This sequence of bits may then be encoded using an entropy encoder 16 to produce a compressed bitstream. The entropy encoder 16 may encode the sequence of bits using a context model 18 that specifies probabilities for coding bits based on a context determination by the entropy encoder 16. The context model 18 may be adaptively updated after coding of each bit or defined set of bits. The entropy encoder 16 may, in some cases, be a binary arithmetic encoder. The binary arithmetic encoder may, in some implementations, employ context-adaptive binary arithmetic coding (CABAC). In some implementations, coders other than arithmetic coders may be used.

In some cases, the entropy encoder 16 may not be a binary coder, but instead may operate on non-binary data. The output octree data from the tree building module 12 may not be evaluated in binary form but instead may be encoded as non-binary data. For example, in the case of an octree, the eight flags within a sub-volume (e.g. occupancy flags) in their scan order may be considered a $2^8-1$ bit number (e.g. an integer having a value between 1 and 255 since the value 0 is not possible for a split sub-volume, i.e. it would not have been split if it was entirely unoccupied). This number may be encoded by the entropy encoder using a multi-symbol arithmetic coder in some implementations. Within a sub-volume, e.g. a cube, the sequence of flags that defines this integer may be termed a "pattern".

Like with video or image coding, point cloud coding can include predictive operations in which efforts are made to predict the pattern for a sub-volume, and the residual from the prediction is coded instead of the pattern itself. Predictions may be spatial (dependent on previously coded sub-volumes in the same point cloud) or temporal (dependent on previously coded point clouds in a time-ordered sequence of point clouds).

Figure 2:
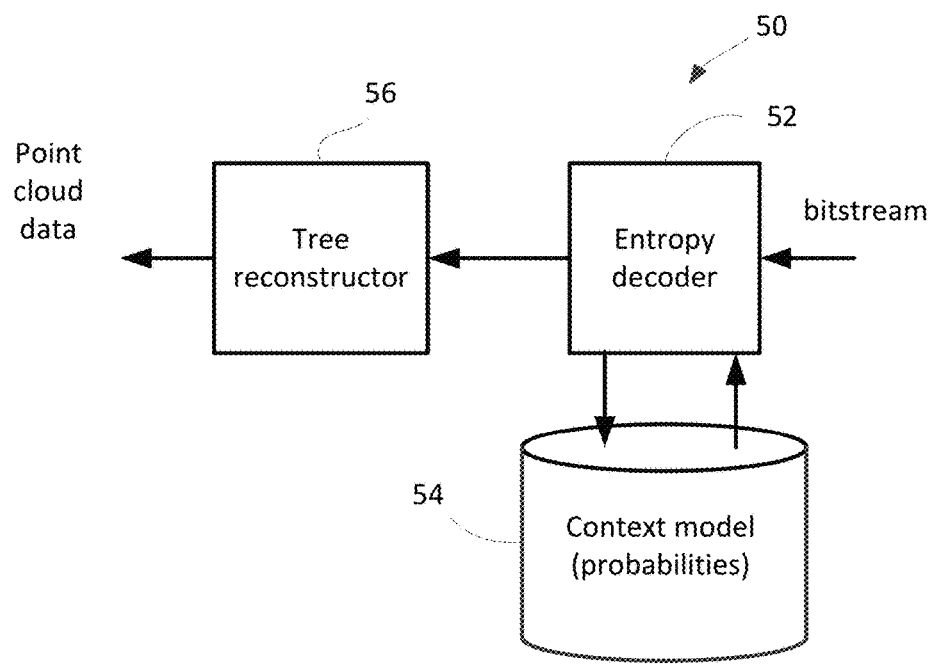
FIG. 2 shows a simplified block diagram of an example point cloud decoder.

A block diagram of an example point cloud decoder 50 that corresponds to the encoder 10 is shown in FIG. 2. The point cloud decoder 50 includes an entropy decoder 52 using the same context model 54 used by the encoder 10. The entropy decoder 52 receives the input bitstream of compressed data and entropy decodes the data to produce an output sequence of decompressed bits. The sequence is then converted into reconstructed point cloud data by a tree reconstructor 56. The tree reconstructor 56 rebuilds the tree structure from the decompressed data and knowledge of the scanning order in which the tree data was binarized. The tree reconstructor 56 is thus able to reconstruct the location of the points from the point cloud (subject to the resolution of the tree coding).

Figure 3:
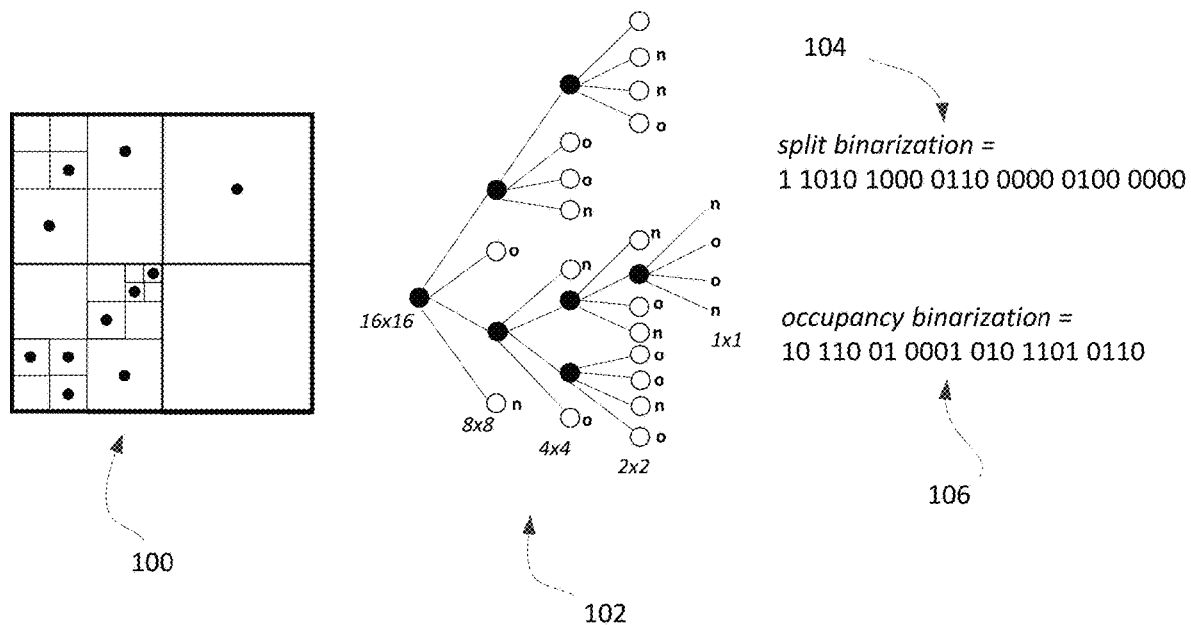
FIG. 3 shows an example partial sub-volume and associated tree structure for coding.

An example partial sub-volume 100 is shown in FIG. 3. In this example, a slice of the sub-volume 100 is shown in two-dimensions for ease of illustration, and the size of the sub-volume 100 is 16×16. It will be noted that the sub-volume has been divided into four 8×8 sub-squares, and two of those have been further subdivided into 4×4 sub-squares, three of which are further divided to 2×2 sub-squares, and one of the 2×2 sub-square is then divided into 1×1 squares. The 1×1 squares are the maximum depth of the tree and represent the finest resolution for positional point data. The points from the point cloud are shown as dots in the figure.

The structure of the tree 102 is shown to the right of the sub-volume 100. The sequence of splitting flags 104 and the corresponding sequence of occupancy flags 106, obtained in a pre-defined breadth-first scan order, is shown to the right of the tree 102. It will be observed that in this illustrative example, there is an occupancy flag for each sub-volume (node) that is not split, i.e. that has an associated splitting flag set to zero. These sequences may be entropy encoded.

Figure 4:
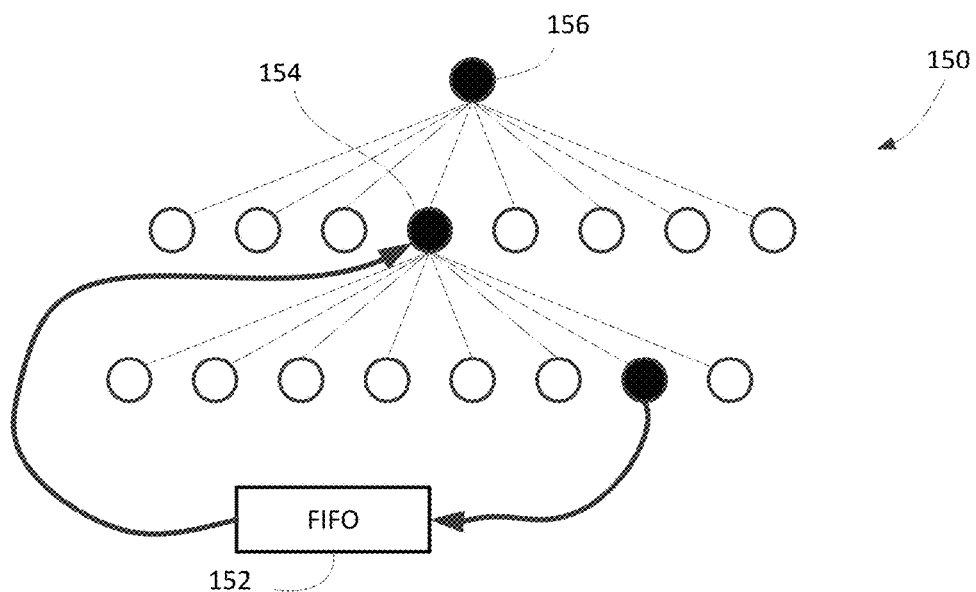
FIG. 4 illustrates the recursive splitting and coding of an octree.

Another example, which employs an occupied ≡ splitting condition, is shown in FIG. 4. FIG. 4 illustrates the recursive splitting and coding of an octree 150. Only a portion of the octree 150 is shown in the figure. A FIFO 152 is shown as processing the nodes for splitting to illustrate the breadth-first nature of the present process. The FIFO 152 outputs an occupied node 154 that was queued in the FIFO 152 for further splitting after processing of its parent node 156. The tree builder splits the sub-volume associated with the occupied node 154 into eight sub-volumes (cubes) and determines their occupancy. The occupancy may be indicated by an occupancy flag for each sub-volume. In a prescribed scan order, the flags may be referred to as the occupancy pattern for the node 154. The pattern may be specified by the integer representing the sequence of occupancy flags associated with the sub-volumes in the pre-defined scan order. In the case of an octree, the pattern is an integer in the range [1, 255].

The entropy encoder then encodes that pattern using a non-binary arithmetic encoder based on probabilities specified by the context model. In this example, the probabilities may be a pattern distribution based on an initial distribution model and adaptively updated. In one implementation, the pattern distribution is effectively a counter of the number of times each pattern (integer from 1 to 255) has been encountered during coding. The pattern distribution may be updated after each sub-volume is coded. The pattern distribution may be normalized, as needed, since the relative frequency of the patterns is germane to the probability assessment and not the absolute count.

Based on the pattern, those child nodes that are occupied (e.g. have a flag=1) are then pushed into the FIFO 152 for further splitting in turn (provided the nodes are not a maximum depth of the tree).

Figure 5:
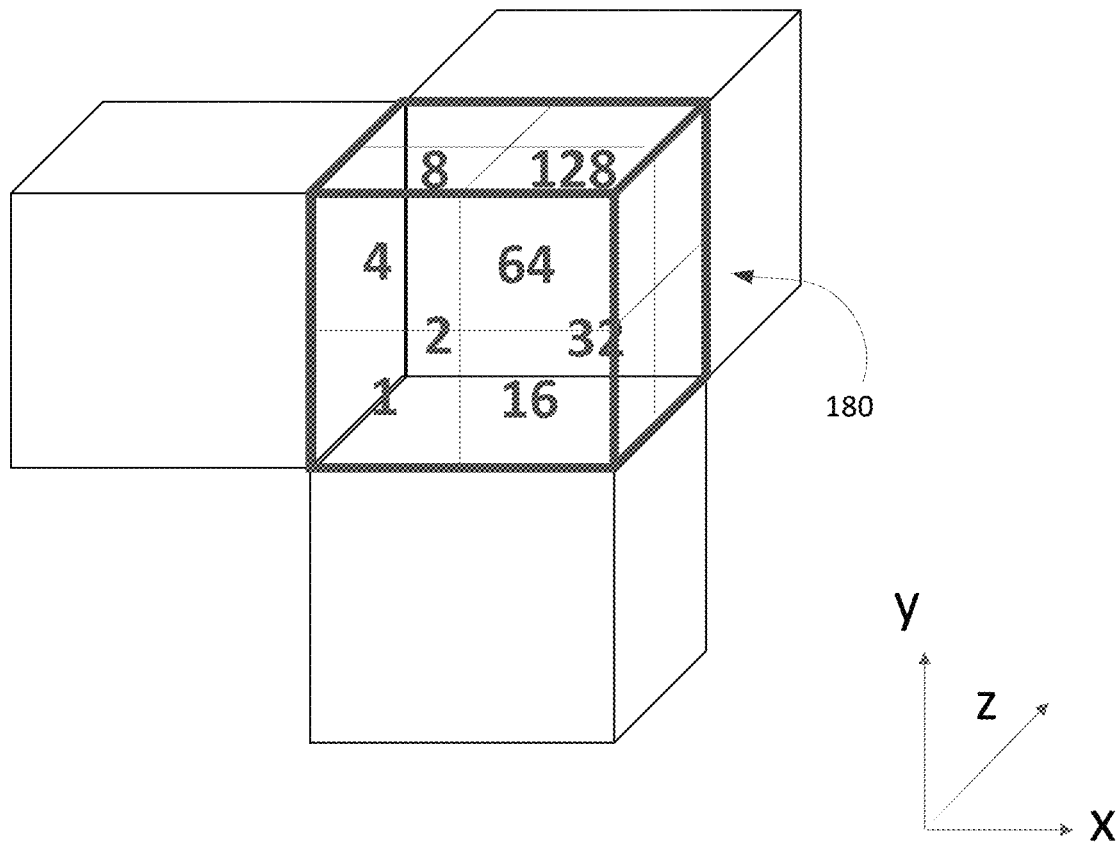
FIG. 5 shows an example scan pattern within an example cube from an octree.

Reference is now made to FIG. 5, which shows an example cube 180 from an octree. The cube 180 is subdivided into eight sub-cubes. The scan order for reading the flags results in an eight bit string, which can be read as an integer [1, 255] in binary. Based on the scan order and the resulting bit position of each sub-cube's flag in the string, the sub-cubes have the values shown in FIG. 5. The scan order may be any sequence of the sub-cubes, provided both the encoder and decoder use the same scan order.

Figure 6:
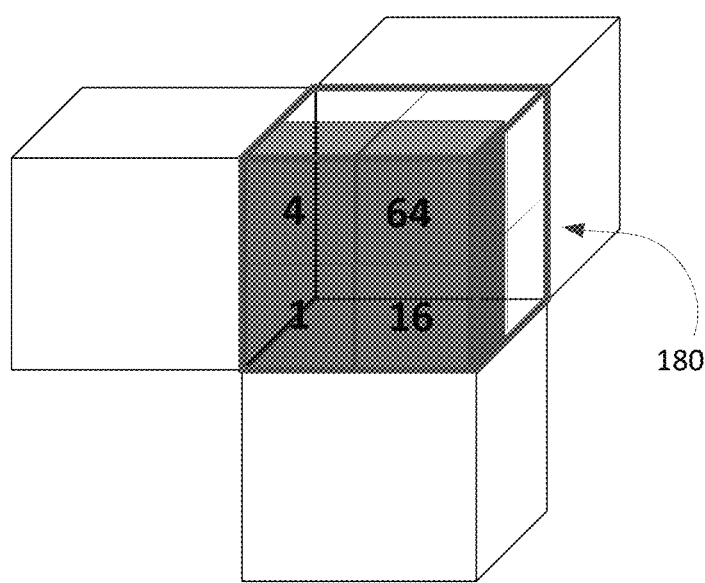
FIG. 6 shows an example occupancy pattern within an example cube.

As an example, FIG. 6 shows the cube 200 in which the four "front" sub-cubes are occupied. This would correspond to pattern 85, on the basis that the sub-cubes occupied are cubes 1+4+16+64. The integer pattern number specifies the pattern of occupancy in the sub-cubes.

An octree representation, or more generally any tree representation, is efficient at representing points with a spatial correlation because trees tend to factorize the higher order bits of the point coordinates. For an octree, each level of depth refines the coordinates of points within a sub-volume by one bit for each component at a cost of eight bits per refinement. Further compression is obtained by entropy coding the split information, i.e. pattern, associated with each tree node. This further compression is possible because the pattern distribution is not uniform—non-uniformity being another consequence of the correlation.

One potential inefficiency in current systems is that the pattern distribution (e.g. the histogram of pattern numbers seen in previously-coded nodes of the tree) is developed over the course of coding the point cloud. In some cases, the pattern distribution may be initialized as equiprobable, or may be initialized to some other pre-determined distribution; but the use of one pattern distribution means that the context model does not account for, or exploit, local geometric correlation.

Accordingly, in accordance with one aspect of the present application, the encoder and decoder each maintain more than one pattern distribution (e.g. set of probabilities associated with occupancy patterns) and select the pattern distribution to be used in coding a particular node's pattern of occupancy based on some occupancy information from previously-coded nodes near the particular node. In one example implementation, the occupancy information is obtained from the pattern of occupancy of the parent to the particular node. In another example implementation, the occupancy information is obtained from one or more nodes neighbouring the particular node.

Figure 7:
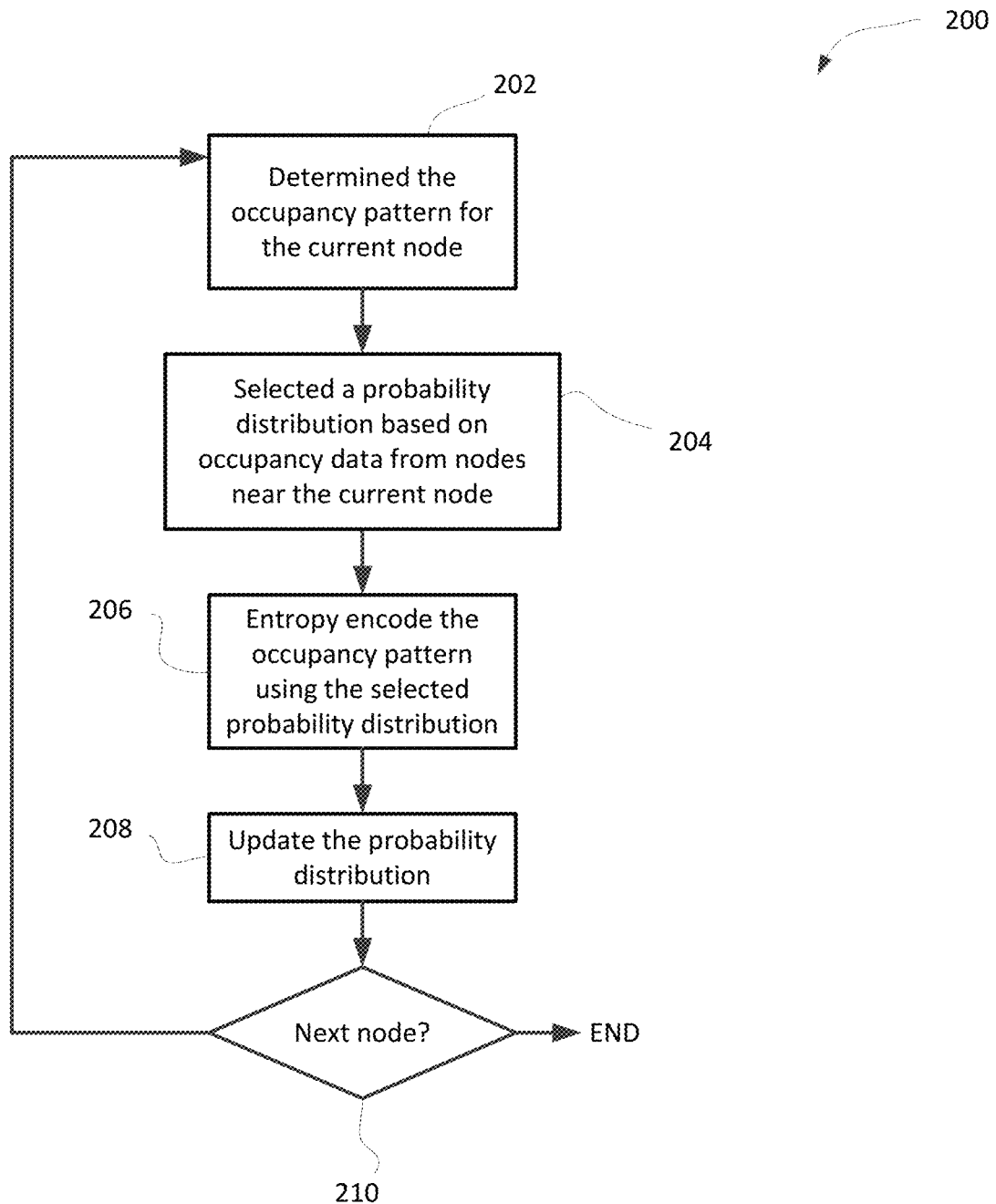
FIG. 7 shows, in flowchart form, one example method for encoding a point cloud.

Reference is now made to FIG. 7, which shows, in flowchart form, one example method 200 of encoding a point cloud. The method 200 in this example involves recursive splitting of occupied nodes (sub-volumes) and a breadth-first traversal of the tree for coding.

In operation 202, the encoder determines the pattern of occupancy for the current node. The current node is an occupied node that has been split into eight child nodes, each corresponding to a respective sub-cube. The pattern of occupancy for the current node specifies the occupancy of the eight child nodes in scan order. As described above, this pattern of occupancy may be indicated using an integer between 1 and 255, e.g. an eight-bit binary string.

In operation 204, the encoder selects a probability distribution from among a set of probability distributions. The selection of the probability distribution is based upon some occupancy information from nearby previously-coded nodes, i.e. at least one node that is a neighbour to the current node. Two nodes are neighbouring, in some embodiments, if they are associated with respective sub-volumes that share at least one face. In a broader definition, nodes are neighboring if they share at least one edge. In yet a broader definition, two nodes are neighboring if they share at least one vertex. The parent pattern within which the current node is a child node, provides occupancy data for the current node and the seven sibling nodes to the current node. In some implementations, the occupancy information is the parent pattern. In some implementations, the occupancy information is a set of neighbour nodes that include nodes at the same depth level of the tree as the current node, but having a different parent node. In some cases, combinations of these are possible. For example, a set of neighbour nodes may include some sibling nodes and some non-sibling nodes.

Once the probability distribution has been selected, then encoder then entropy encodes the occupancy pattern for the current node using the selected probability distribution, as indicated by operation 206. It then updates the selected probability distribution in operation 208 based on the occupancy pattern, e.g. it may increment the count corresponding to that occupancy pattern. In operation 210, the encoder evaluates whether there are further nodes to code and, if so, returns to operation 202 to code the next node.

Figure 8:
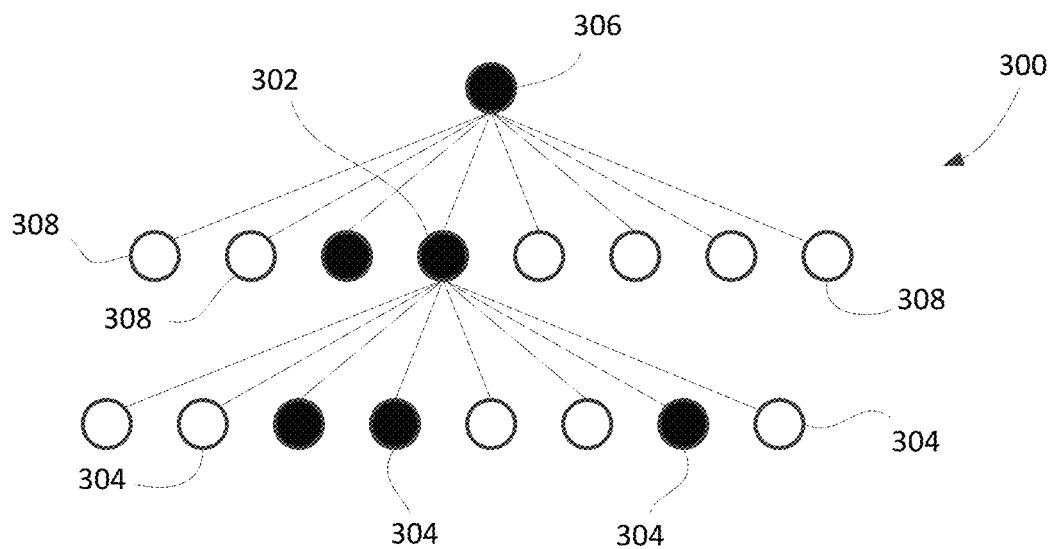
FIG. 8 illustrates a portion of an example octree.

The probability distribution selection in operation 204 is to be based on occupancy data for nearby previously-coded nodes. This allows both the encoder and decoder to independently make the same selection. For the below discussion of probability distribution selection, reference will be made to FIG. 8, which diagrammatically illustrates a partial octree 300, including a current node 302. The current node 302 is an occupied node and is being evaluated for coding. The current node 302 is one of eight children of a parent node 306, which in turn is a child to a grand-parent node (not shown). The current node 302 is divided into eight child nodes 304. The occupancy pattern for the current node 302 is based on the occupancy of the child nodes 304. For example, as illustrated, using the convention that a black dot is an occupied node, the occupancy pattern may be 00110010, i.e. pattern 50.

The current node 302 has sibling nodes 308 that have the same parent node 306. The parent pattern is the occupancy pattern for the parent node 306, which as illustrated would be 00110000, i.e. pattern 48. The parent pattern may serve as the basis for selecting a suitable probability distribution for entropy encoding the occupancy pattern for the current node.

Figure 9:
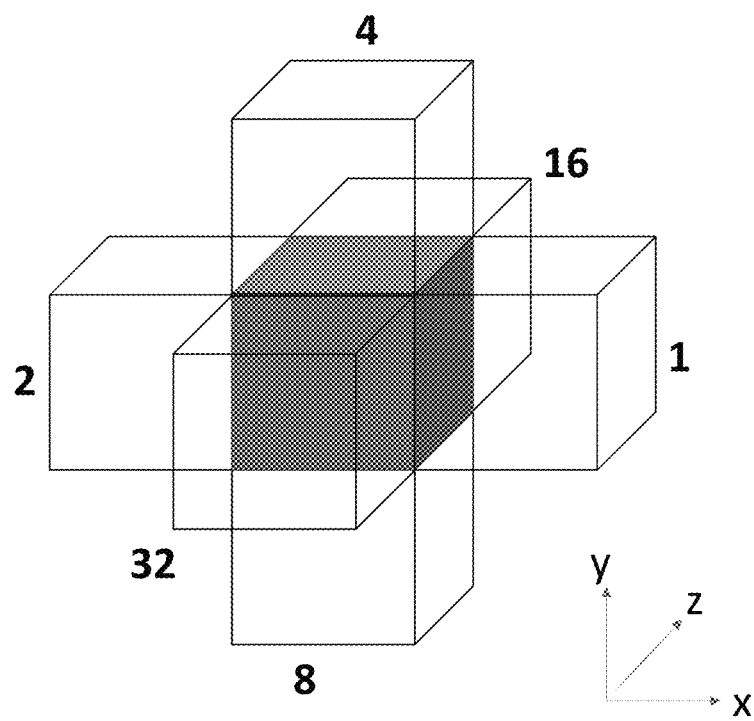
FIG. 9 shows an example of neighbouring sub-volumes.

FIG. 9 illustrates a set of neighbors surrounding a current node, where neighbour is defined as nodes sharing a face. In this example, the nodes/sub-volumes are cubes and the cube at the center of the image has six neighbours, one for each face. In an octree, it will be appreciated that neighbours to the current node will include three sibling nodes. It will also include three nodes that do not have the same parent node. Accordingly, some of the neighboring nodes will be available because they are siblings, but some neighbouring nodes may or may not be available, depending on whether those nodes were previously coded. Special handling may be applied to deal with missing neighbours. In some implementations, the missing neighbour may be presumed to be occupied or may be presumed to be unoccupied. It will be appreciated that the neighbour definition may be broadened to include neighbouring nodes based on a shared edge or based on a shared vertex to include additional adjacent sub-volumes in the assessment.

It will also be appreciated that assessing the immediate surrounding neighbourhood of the current node 302 based on the occupancy status of neighbouring nodes may be a more accurate assessment of isolation than assessing the occupancy status of siblings, three of which will only share an edge and one of which will only share a vertex (in the case of an octree). However, the assessment of occupancy status of siblings has the advantage of being modular in that all the relevant data for the assessment is part of the parent node, meaning it has a smaller memory footprint for implementation, whereas assessment of neighbour occupancy status involves buffering tree occupancy data in case it is needed to perform an eligibility assessment for a future neighbouring node.

Figure 10:
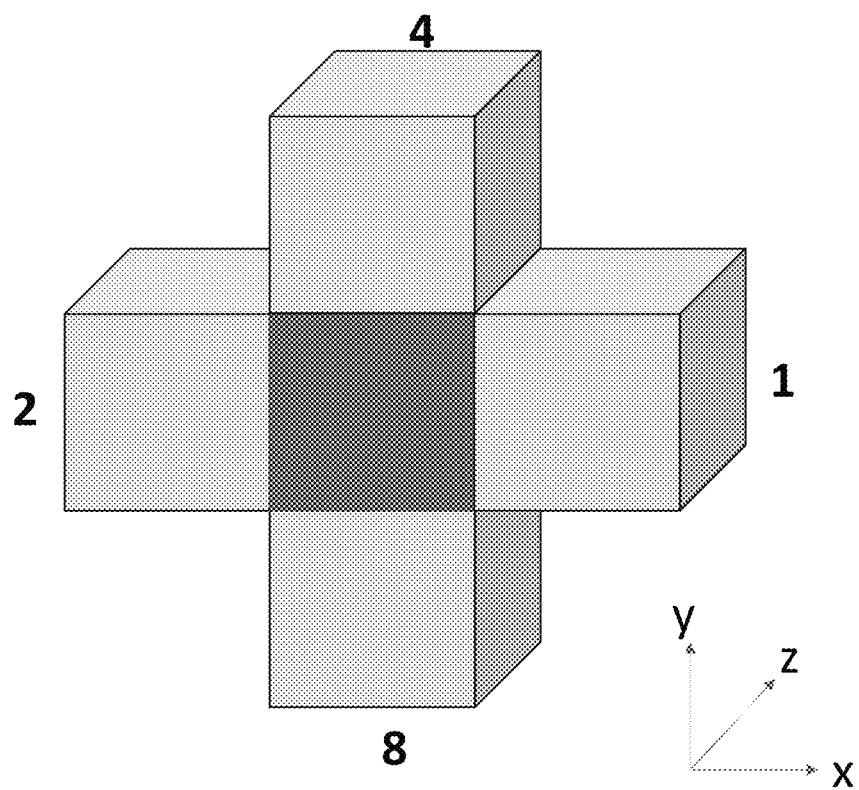
FIG. 10 shows an example neighbour configuration showing occupancy among neighbouring nodes.

The occupancy of the neighbours may be read in a scan order that effectively assigns a value to each neighbour, much like as is described above with respect to occupancy patterns. As illustrated, the neighbouring nodes effectively take values of 1, 2, 4, 8, 16 or 32, and there are therefore 64 (0 to 63) possible neighbour occupancy configurations. This value may be termed the "neighbour configuration" herein. As an example, FIG. 10 illustrates an example of neighbour configuration 15, in which neighbours 1, 2, 4 and 8 are occupied and neighbours 16 and 32 are empty.

In some cases, the two above criteria (parent pattern and neighbour configuration) may be both applied or may be selected between. For example, if neighbours are available then the probability distribution selection may be made based on the neighbouring nodes; however, if one or more of the neighbours are unavailable because they are from nodes not-yet coded, then the probability distribution selection may revert to an analysis based on sibling nodes (parent pattern).

In yet another embodiment, the probability distribution selection may be alternatively, or additionally, be based on the grandparent pattern. In other words, the probability distribution selection may be based on the occupancy status of the uncle nodes that are siblings to the parent node 306.

In yet further implementation, additional or alternative assessments may be factored into the probability distribution selection. For example, the probability distribution selection may look at the occupancy status of neighbour nodes to the parent node, or neighbour nodes to the grand-parent node.

Any two or more of the above criteria for assessing local occupancy status may be used in combination in some implementations.

In some embodiments, the number of probability distributions may equal the number of possible occupancy outcomes in the selection criteria. In other words, in the case a parent pattern for an octree, there would be 255 probability distributions. In the case of neighbour configuration, if neighbour is defined as sharing a face, there would be 64 probability distributions. However, it will be understood that too many distributions may result in slow adaptation due to scarcity of data, i.e. context dilution. Accordingly, in some embodiments, similar patterns may be grouped so as to use the same probability distribution. For example separate distributions may be used for patterns corresponding to fully occupied, vertically-oriented, horizontally-oriented, mostly empty, and then all other cases. This could reduce the number of probability distributions to about five. It will be appreciated that different groupings of patterns could be formed to result in a different number of probability distributions.

Figure 11:
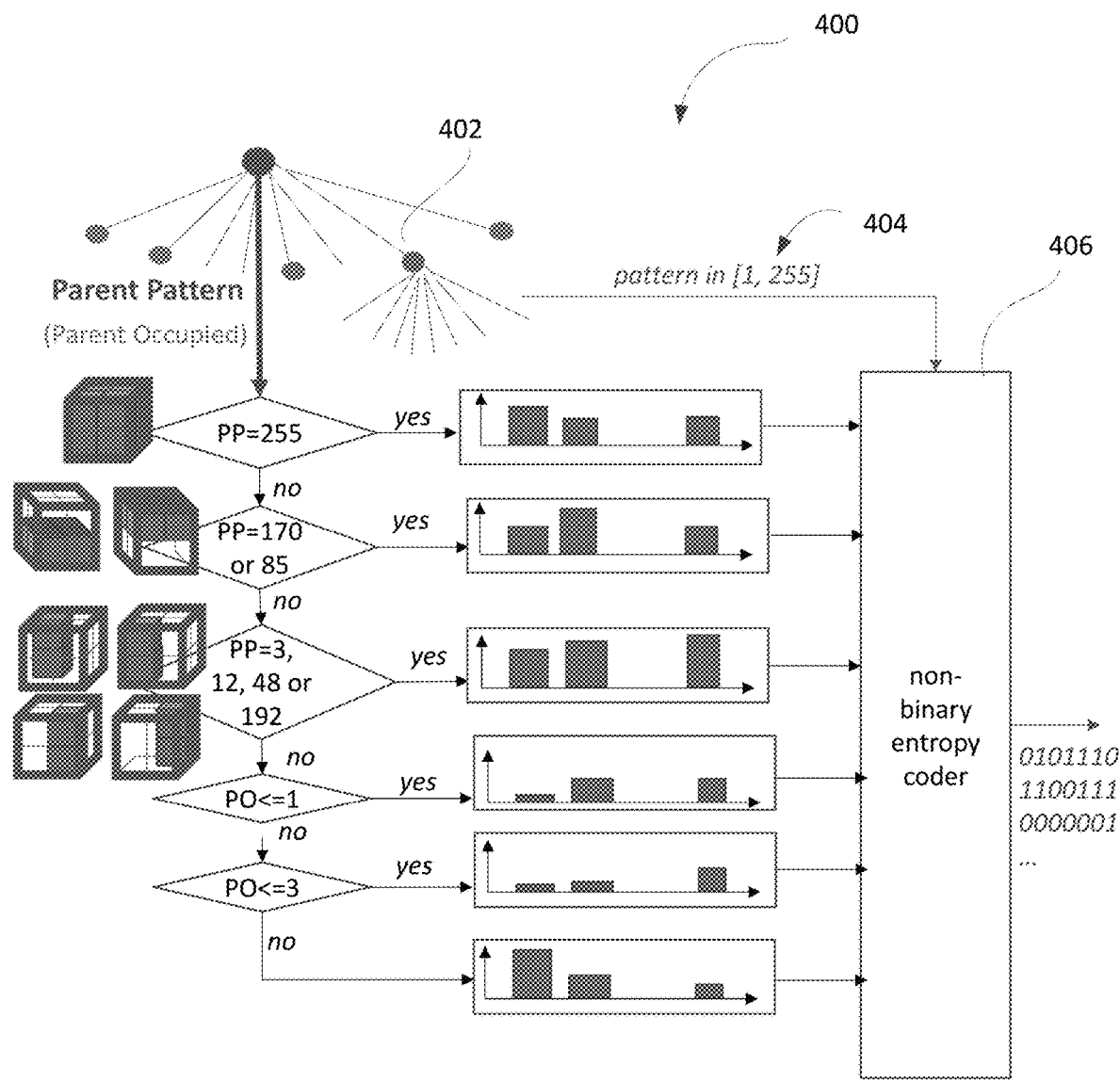
FIG. 11 diagrammatically shows one illustrative embodiment of a process of point cloud entropy encoding using parent-pattern-dependent context.

Reference is now made to FIG. 11, which diagrammatically shows one illustrative embodiment of a process 400 of point cloud entropy encoding using parent-pattern-dependent context. In this example, a current node 402 has been split into eight child nodes and its occupancy pattern 404 is to be encoded using a non-binary entropy encoder 406. The non-binary entropy encoder 406 uses a probability distribution selected from one of six possible probability distributions 408. The selection is based on the parent pattern—that is the selection is based on occupancy information from the parent node to the current node 402. The parent pattern is identified by an integer between 1 and 255.

The selection of the probability distribution may be a decision tree that assesses whether the pattern corresponds to a full node (e.g. pattern=255), a horizontal structure (e.g. pattern=170 or 85; assuming the Z axis is vertical), a vertical structure (e.g. pattern=3, 12, 48, 192), a sparsely populated distribution (e.g. pattern=1, 2, 4, 8, 16, 32, 64, or 128; i.e. none of the sibling nodes are occupied), a semi-sparsely populated distribution (total number of occupied nodes among current node and sibling nodes≤3), and all other cases. The example patterns indicated for the different categories are merely examples. For example, the "horizontal" category may include patterns involving two or three occupied cubes on the same horizontal level. The "vertical" category may include patterns involving three or four occupied cubes in a wall-like arrangement. It will also be appreciated that finer gradations may be used. For example, the "horizontal" category may be further subdivided into horizontal in the upper part of the cube and horizontal in the bottom part of the cube with different probability distributions for each. Other groupings of occupancy patterns having some correlation may be made and allocated to a corresponding probability distribution. Further discussion regarding grouping of patterns in the context of neighbourhood configurations, and invariance between neighbourhood configurations is set out further below.

Figure 12:
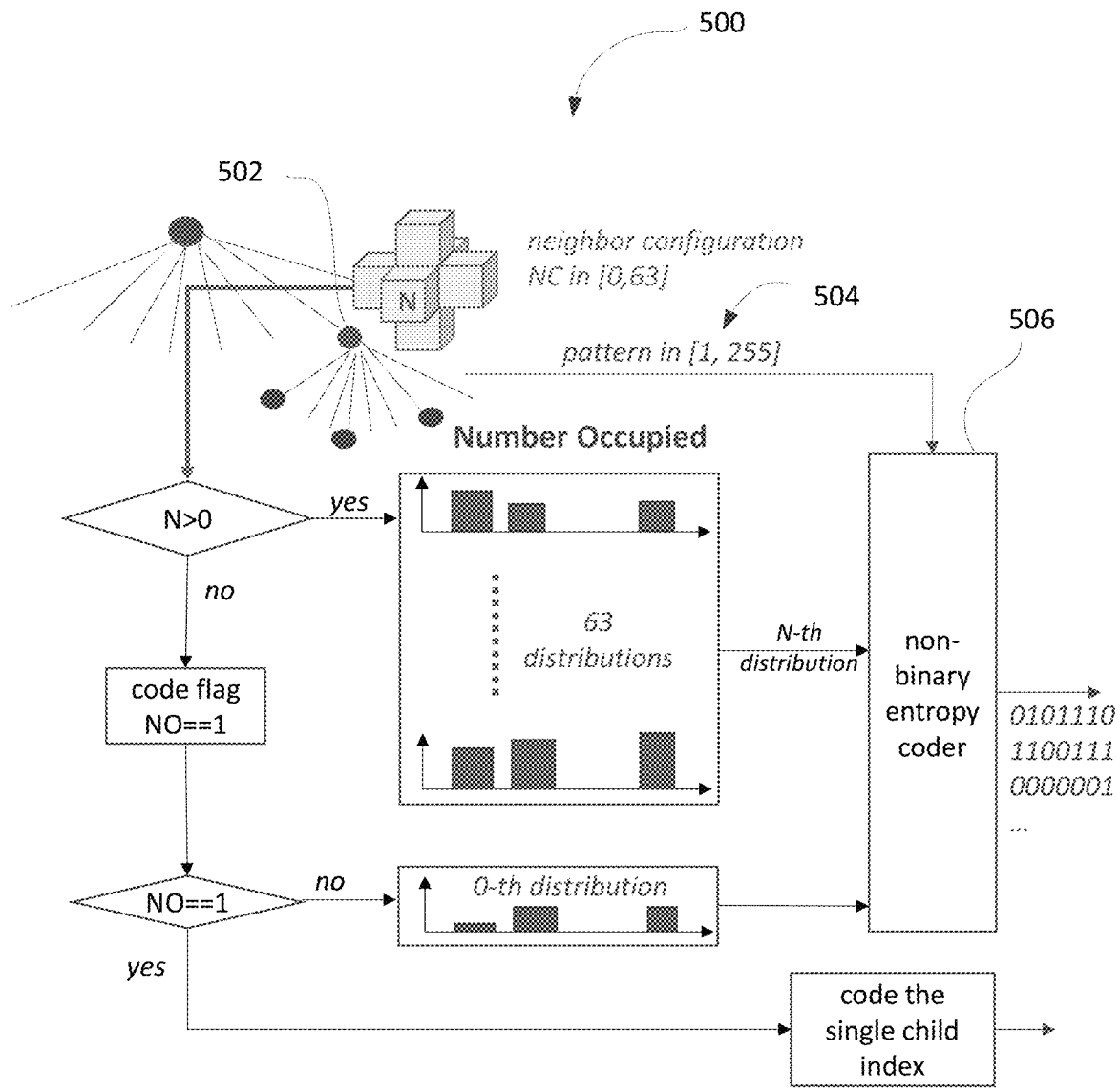
FIG. 12 shows an illustrative embodiment of a process of point cloud entropy encoding using neighbour-configuration-dependent context.

FIG. 12 shows an illustrative embodiment of a process 500 of point cloud entropy encoding using neighbour-configuration-dependent context. This example assumes the definition of neighbour and neighbour configuration numbering used above in connection with FIG. 9. This example also presumes that each neighbour configuration has a dedicated probability distribution, meaning there are 64 different probability distributions. A current node 502 has an occupancy pattern 504 to be encoded. The probability distribution is selected based on the neighbouring nodes to the current node 502. That is, the neighbour configuration NC in [0, 63] is found and used to select the associated probability distribution.

It will be appreciated that in some embodiments, neighbour configurations may be grouped such that more than one neighbour configuration uses the same probability distribution based on similarities in the patterns. In some embodiments, the process may use a different arrangement of neighbours for contextualisation (selection) of the distributions. Additional neighbours may be added such as the eight neighbours diagonally adjacent on all three axes, or the twelve diagonally adjacent on two axes. Embodiments that avoid particular neighbours may also be used, for example to avoid using neighbours that introduce additional dependencies in a depth-first scan, or only introduce dependencies on particular axes so as to reduce codec state for large trees.

In this example, the case of NC=0 is handled in a specific manner. If there are no neighbours that are occupied, it may indicate that the current node 502 is isolated. Accordingly, the process 500 further checks how many of the child nodes to the current node 502 are occupied. If only one child node is occupied, then a flag is encoded indicated that a single child node is occupied and the index to the node is coded using 3 bits. If more than one child node is occupied, then the process 500 uses the NC=0 probability distribution for coding the occupancy pattern.

Figure 13:
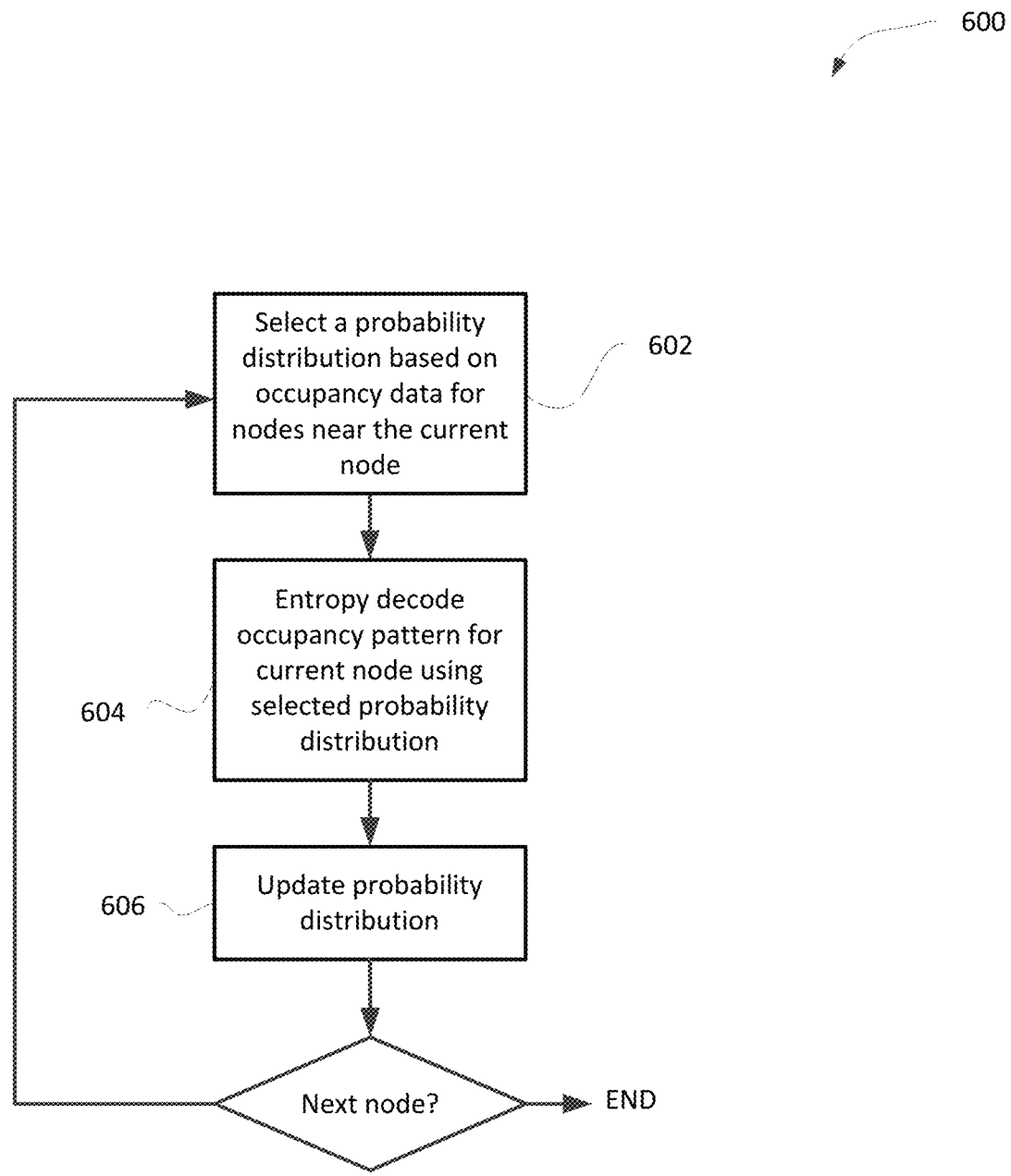
FIG. 13 shows, in flowchart form, one example method for decoding a bitstream of compressed point cloud data.

Reference is now made to FIG. 13, which shows, in flowchart form, one example method 600 for decoding a bitstream of encoded point cloud data.

In operation 602, the decoder selects one of the probability distributions based on occupancy information from one or more nodes near the current node. As described above, the occupancy information may be a parent pattern from the parent node to the current node, i.e. occupancy of the current node and its siblings, or it may be occupancy of neighbouring nodes to the current node, which may include some of the sibling nodes. Other or additional occupancy information may be used in some implementations.

Once the probability distribution has been selected then in operation 604 the decoder entropy decode a portion of the bitstream using the selected probability distribution to reconstruct the occupancy pattern for the current node. This pattern is part of the decoder reconstructing the tree so as to recover the encoded point cloud data. Once the point cloud data is decoded, it may be output from the decoder for use, such as for rendering a view, segmentation/classification, or other applications.

In operation 606, the decoder updates the probability distribution based on the reconstructed occupancy pattern, and then if there are further nodes to decode, then it moves to the next node in the buffer and returns to operation 602.

Example implementations of the above-described methods have proven to provide a compression improvement with a negligible increase in coding complexity. The neighbour-based selection shows a better compression performance than the parent-pattern based selection, although it has a greater computational complexity and memory usage. In some testing the relative improvement in bits-per-point over the MPEG Point Cloud Test Model is between 4 and 20%. It has been noted that initializing the probability distributions based on a distribution arrived at with test data leads to improved performance as compared to initializing with a uniform distribution.

Some of the above examples are based on a tree coding process that uses a non-binary coder for signaling occupancy pattern. It will be appreciated that the processes may be modified to use a context adaptive binary entropy coder (CABAC). Occupancy patterns may be binarized as a cascade of binary information or pattern index.

In one variation to the neighbour-based probability distribution selection, the number of distributions may be reduced by exploiting the symmetry of the neighbourhood. By permuting the neighbourhood or permuting the pattern distribution, structurally similar configurations having a line of symmetry can re-use the same distribution.

Consider, as an example, the eight corner patterns NC $\in$ [21, 22, 25, 26, 37, 38, 41, 42], each representing a symmetry of a corner neighbour pattern. It is likely that these values of NC are well correlated with particular but different patterns of a node. It is further likely that these correlated patterns follow the same symmetries as the neighbour pattern. By way of example, a method may be implemented that re-uses a single distribution to represent multiple cases of NC by way of permuting the probabilities of that distribution.

An encoder derives the pattern number of a node based on the occupancy of the child nodes. For the child nodes 0 . . . 7, a bit c corresponding to occupancy is defined. The pattern number is derived as $pn=\sum_{i=0}^{7} 2^{i} \times c_i$. The encoder selects a distribution and a permutation function according to the neighbourhood configuration. The encoder reorders the probabilities contained within the distribution according to the permutation function, and subsequently uses the permuted distribution to arithmetically encode the pattern number. Updates to the probabilities of the permuted distribution by the arithmetic encoder are mapped back to the original distribution by way of an inverse permutation function.

A corresponding decoder first selects the same distribution and permutation function according to the neighbourhood configuration. A permuted distribution is produced in an identical manner to the encoder, with the permuted distribution being used by the arithmetic decoder to entropy decode the pattern number. The bits comprising the pattern number are then each assigned to the corresponding child $(\Left\lfloor \div\{pn\}\{2^i\}\Right\rfloor \text{mod} 2\}$ for 0<i<8).

It should be noted that the same permutation may be achieved without reordering the data of the distribution itself, but rather introducing a level of indirection and using the permutation function to permute the lookup of a given index in the distribution.

An alternative embodiment considers permutations of the pattern itself rather than the distribution, allowing for a shuffling prior to or after entropy encoding/decoding respectively. Such a method is likely to be more amenable to efficient implementation through bit-wise shuffle operations. In this case, no reordering of the distribution is performed by either the encoder or decoder, rather the computation of the pattern number is modified to be pn=\sum_{i=0}^7 2^i c_{f(i)}, where f(i) is the permutation function. One such example of the function f(i)=({4,7,6,5,0,3,2,1})[i], allowing for the use of the single distribution for NC=22 to be used for that of NC=41.

Methods to derive the required permutation may be based on rotational symmetries of the neighbourhood configurations, or may be based on reflections along particular axes. Furthermore, it is not necessary for the permutation to permute all positions according to, for instance, the symmetry; a partial permutation may be used instead. For example, when permuting NC=22 to NC=41, the positions in the axis of symmetry may not be permuted, leading to the mapping {0,7,2,5,4,3,6,1}, where positions 0,2,4,6 are not permuted. In other embodiments, only the pair 1 and 7 are swapped.

Figure 16:
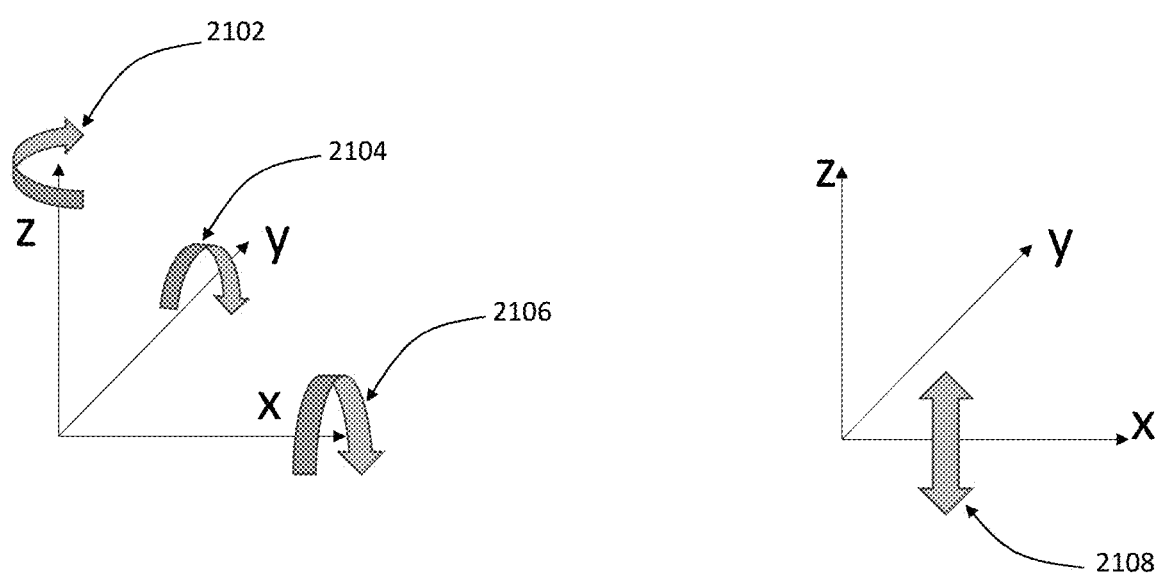
FIG. 16 shows an example Cartesian coordinate system and example rotations about the axes.

Examples of embodiments based on rotational symmetries and reflections are provided hereafter for the specific case of an octree with six neighbors sharing a common face with the current cube. Without loss of generality, as shown in FIG. 16, the Z axis extends vertically relative to the direction of viewing the figure. Relative positions of neighbours such as "above" (resp. "below") should then be understood as along the Z axis in increasing (resp. decreasing) Z direction. The same remark applies for left/right along the X axis, and front/back along the Y axis.

FIG. 16 shows three rotations 2102, 2104 and 2106 along the Z, Y and X axes, respectively. The angle of these three rotations is 90 degrees, i.e. they perform a rotation along their respective axis by a quarter of a turn.

Figure 17:
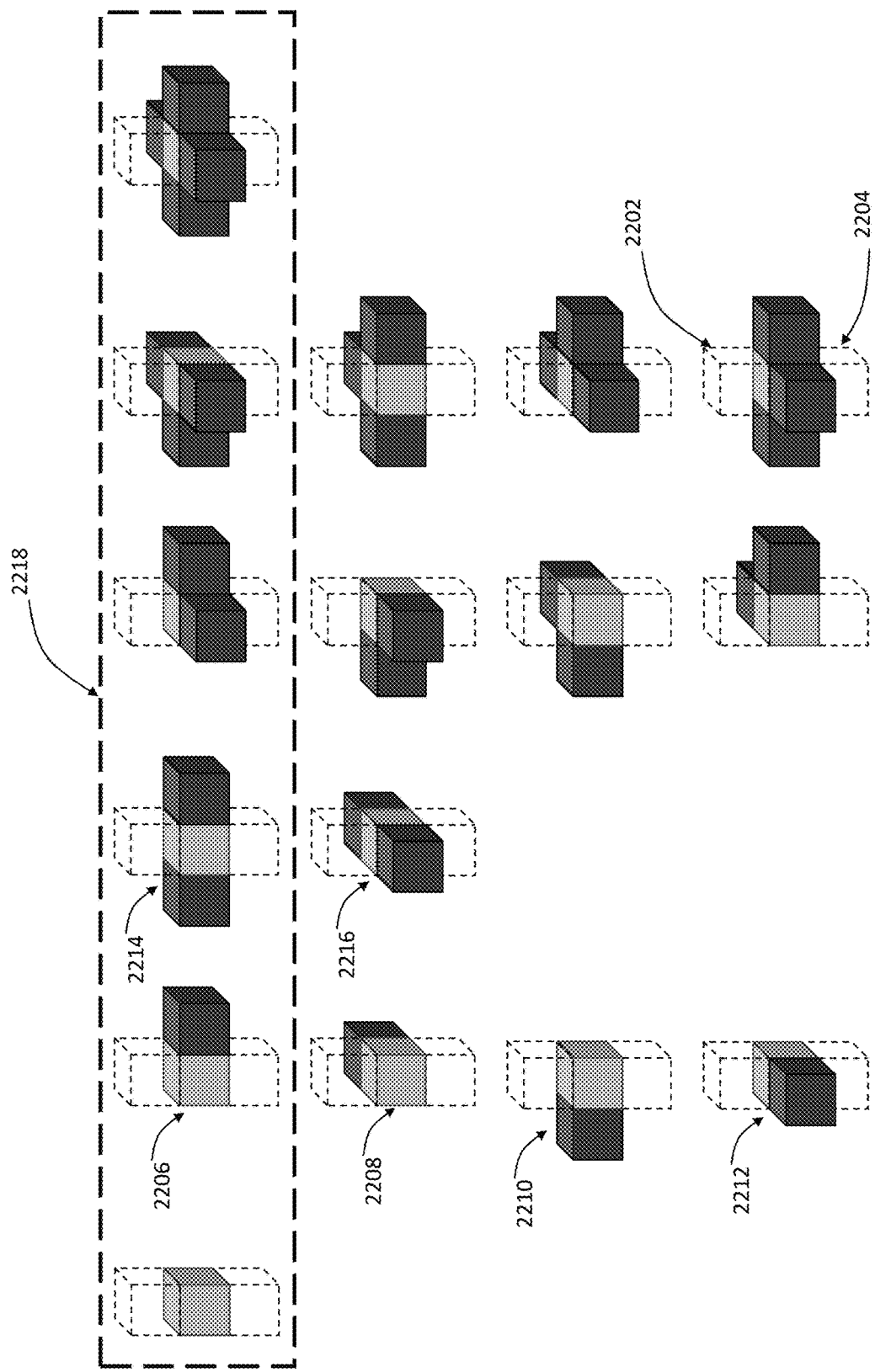
FIG. 17 shows classes of invariance of neighbor configuration under one or several iterations of the rotation about the Z axis.

FIG. 17 shows classes of invariance of neighbor configuration under one or several iterations of the rotation 2102 along the Z axis. This invariance is representative of the same statistical behavior of the point cloud geometry along any direction belonging to the XY plane. This is particularly true for the use-case of a car moving on the Earth surface that is locally approximated by the XY plane. A horizontal configuration is the given occupancy of the four neighbors (located at the left, right, front and back of the current cube) independently of the occupancy of the above neighbour (2202) and the below neighbour (2204). The four horizontal configurations 2206, 2208, 2210 and 2212 belong to the same class of invariance under the rotation 2102. Similarly, the two configurations 2214 and 2216 belong to the same class of invariance. There are only six classes (grouped under the set of classes 2218) of invariance under the rotation 2102.

Figure 18:
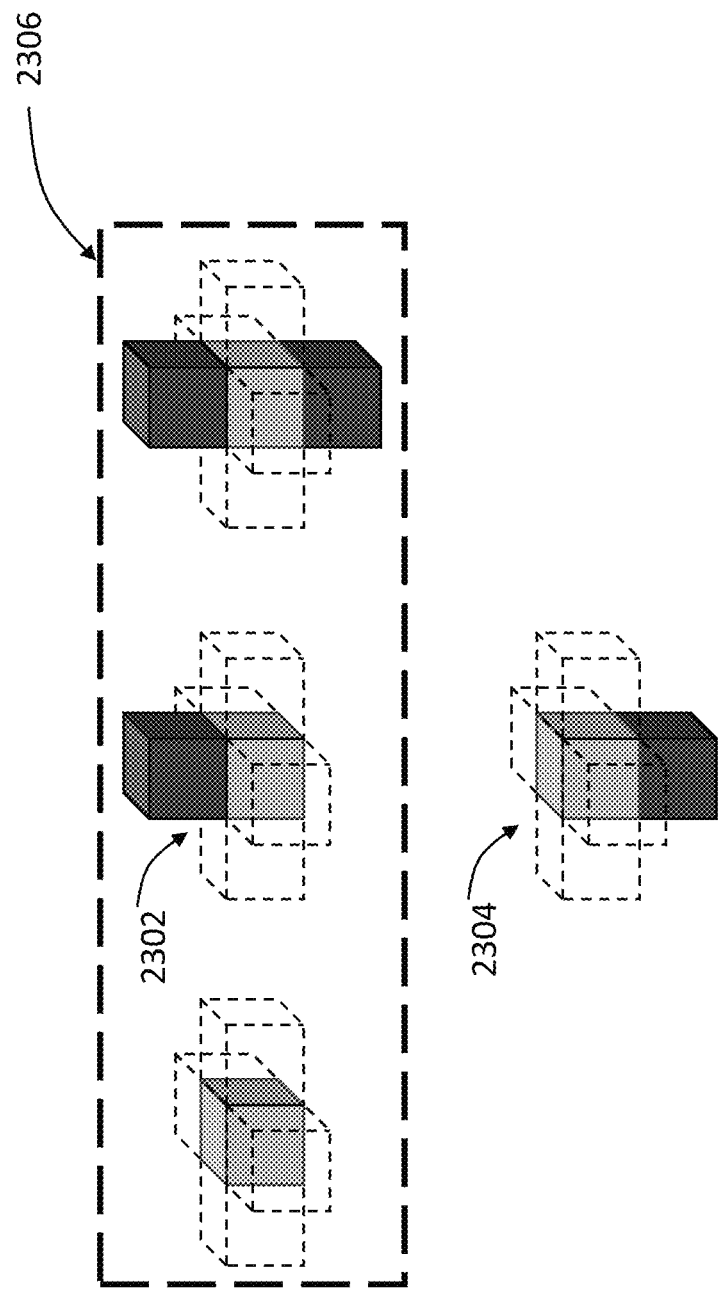
FIG. 18 shows classes of invariance of neighbor configuration for vertical rotation.

A vertical configuration is the given occupancy of the two neighbors 2202 and 2204 independently of the occupancy of the four neighbours located at the left, right, front and back of the current cube. There are four possible vertical configurations as shown on FIG. 18. Consequently, if one considers invariance relatively to the rotation 2102 along the Z axis, there are 6×4=24 possible configurations.

The reflection 2108 along the Z axis is shown on FIG. 16. The vertical configurations 2302 and 2304 depicted on FIG. 18 belong to the same class of invariance under the reflection 2108. There are three classes (grouped under the set of classes 2306) of invariance under the reflection 2108. The invariance under reflection 2108 means that upward and downward directions behave essentially the same in term of point cloud geometry statistics. It is an accurate assumption for a moving car on a road.

Figure 19:
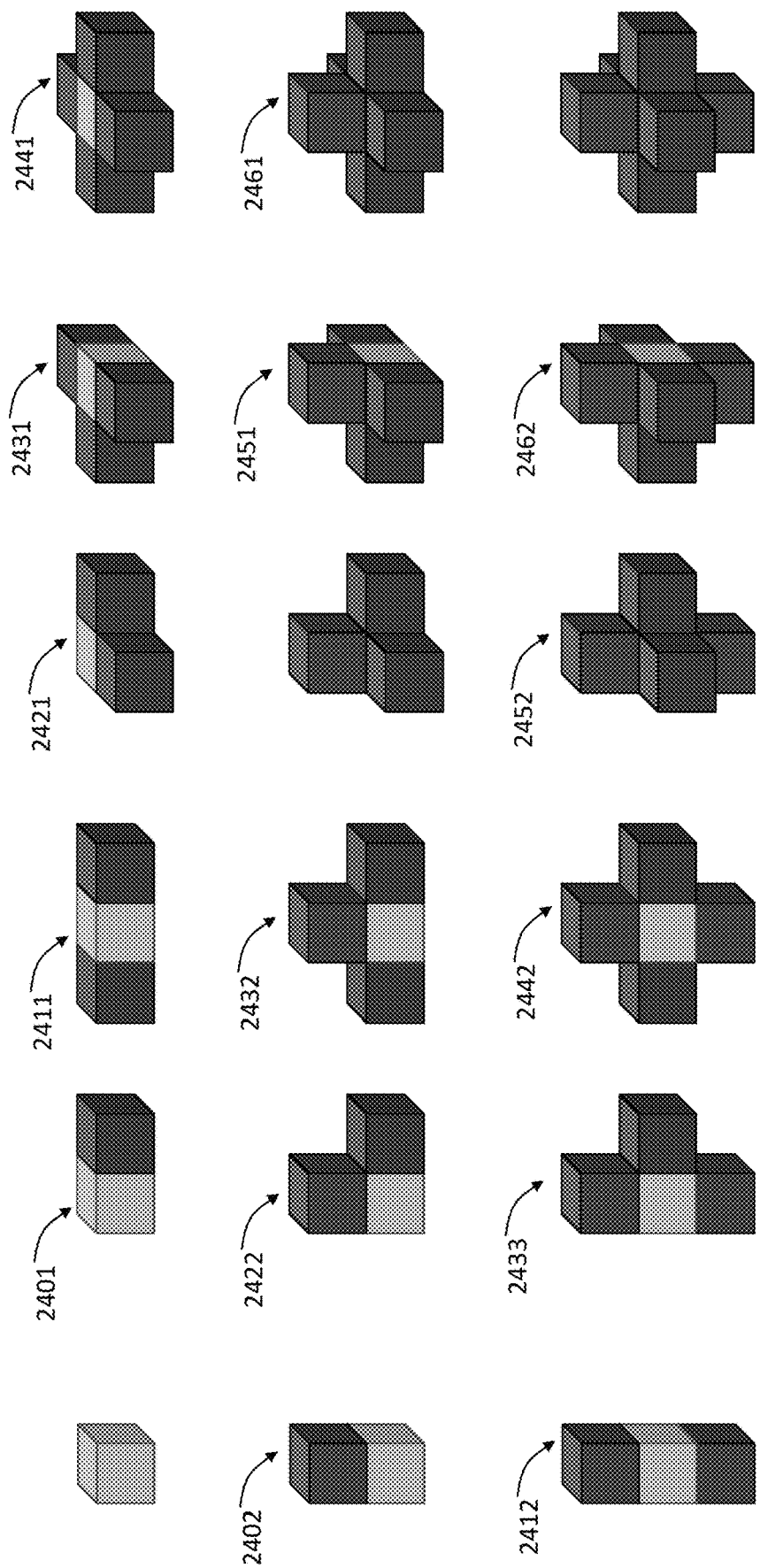
FIG. 19 shows classes of invariance for both rotation and reflection.

If one assumes invariance under both the rotation 2102 and the reflection 2108 there are 18 classes of invariances, resulting from the product of the two sets 2218 and 2306. These 18 classes are represented in FIG. 19.

Figure 20:
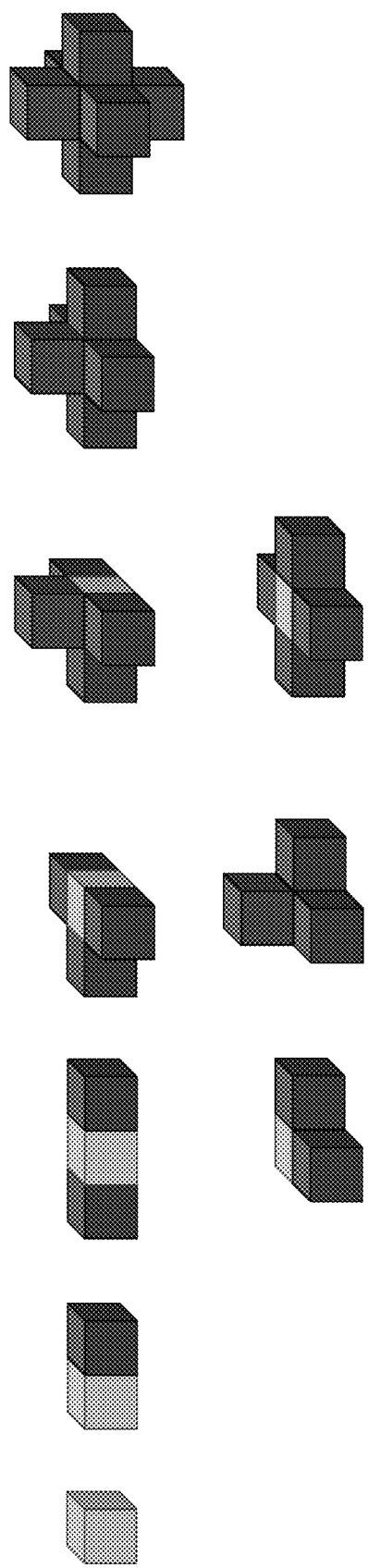
FIG. 20 shows classes of invariance for under three rotations and the reflection.

Applying further invariance under the two other rotations 2104 and 2106, the two configurations 2401 and 2402 belong to the same class of invariance. Furthermore, the two configurations 2411 and 2412, the two configurations 2421 and 2422, the three configurations 2431, 2432 and 2433, the two configurations 2441 and 2442, the two configurations 2451 and 2452, and finally the two configurations 2461 and 2462 belong to same classes. Consequently, invariance under the three rotations (2102, 2104 and 2106) and the reflection 2108 leads to 10 classes of invariance as shown on FIG. 20.

From the examples provided hereinabove, assuming or not invariance under three rotations and the reflection, the number of effective neighbouring configurations is either 64, 24, 18 or 10. In testing, improved compression performance has been noted in the case of the 18 configurations because underlying assumptions on invariance (rotation and reflection along Z) are practically well-fulfilled, thus not degrading distribution accuracy, while providing faster distribution convergence due to a smaller number of distributions (18 vs. 64) to update. However, one observes a non-negligible degradation of the performance for 10 (vs. 18) configurations because XY axes on one hand, and the Z axis on the other hand behave statistically differently. The setup with 10 configurations may be interesting in applications where the number of configurations must be reduced to fulfil memory footprint and/or complexity constraints.

Prior to entropy coding, the pattern undergoes the same transformation, i.e. rotations and reflection, as the neighbor configuration does to belong to one of the invariance class. This preserves the statistical consistency between the invariant neighboring configuration and the coded pattern It will also be understood that during the traversal of a tree, a child node will have certain neighbouring nodes at the same tree depth that have been previously visited and may be causally used as dependencies. For these same-level neighbours, instead of consulting the parent's collocated neighbour, the same-level neighbours may be used. Since the same-level neighbours have halved dimensions of the parent, one configuration considers the neighbour occupied if any of the four directly adjacent neighbouring child nodes (i.e., the four sharing a face with the current node) are occupied.

Figure 14:
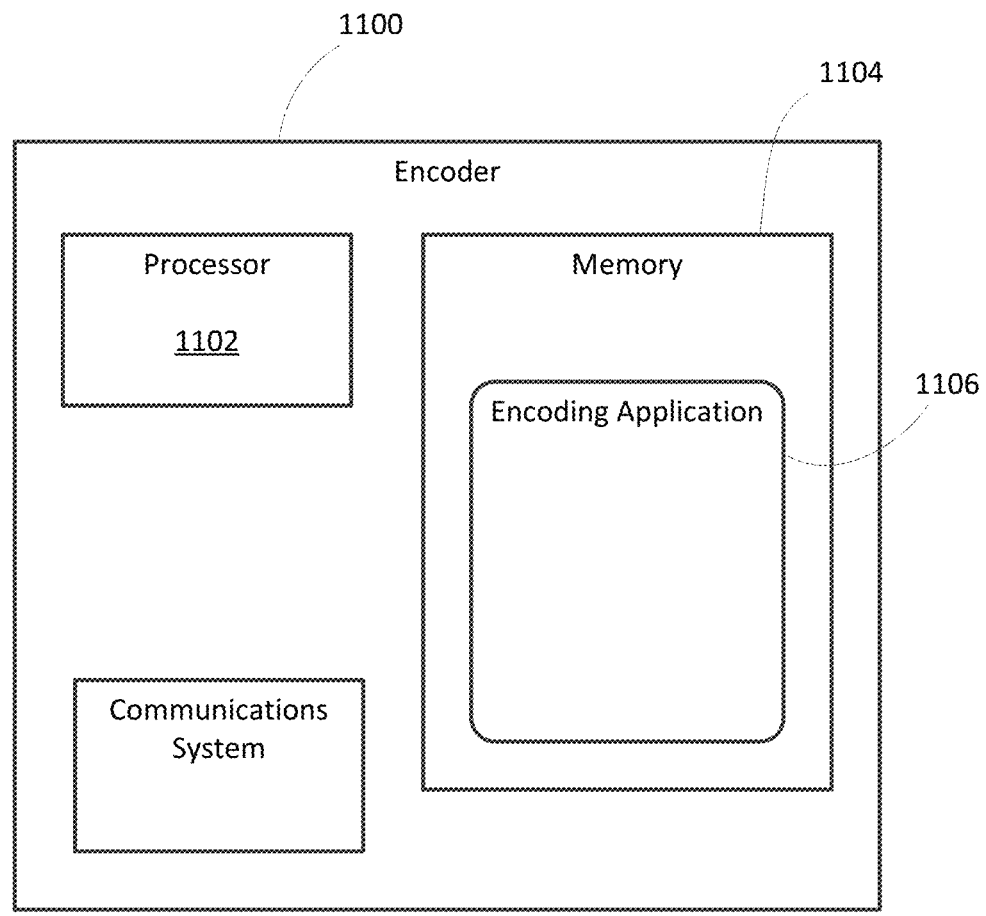
FIG. 14 shows an example simplified block diagram of an encoder.

Reference is now made to FIG. 14, which shows a simplified block diagram of an example embodiment of an encoder 1100. The encoder 1100 includes a processor 1102, memory 1104, and an encoding application 1106. The encoding application 1106 may include a computer program or application stored in memory 1104 and containing instructions that, when executed, cause the processor 1102 to perform operations such as those described herein. For example, the encoding application 1106 may encode and output bitstreams encoded in accordance with the processes described herein. It will be understood that the encoding application 1106 may be stored on a non-transitory computer-readable medium, such as a compact disc, flash memory device, random access memory, hard drive, etc. When the instructions are executed, the processor 1102 carries out the operations and functions specified in the instructions so as to operate as a special-purpose processor that implements the described process(es). Such a processor may be referred to as a "processor circuit" or "processor circuitry" in some examples.

Figure 15:
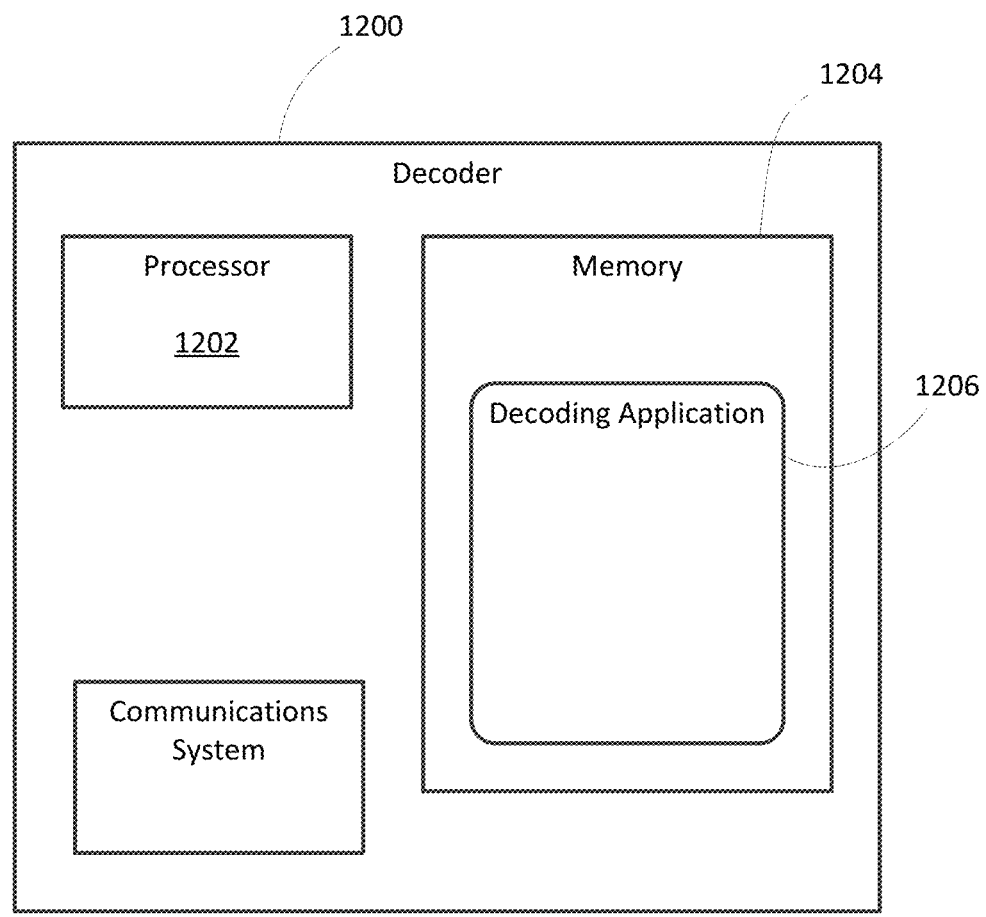
FIG. 15 shows an example simplified block diagram of a decoder.

Reference is now also made to FIG. 15, which shows a simplified block diagram of an example embodiment of a decoder 1200. The decoder 1200 includes a processor 1202, a memory 1204, and a decoding application 1206. The decoding application 1206 may include a computer program or application stored in memory 1204 and containing instructions that, when executed, cause the processor 1202 to perform operations such as those described herein. It will be understood that the decoding application 1206 may be stored on a computer-readable medium, such as a compact disc, flash memory device, random access memory, hard drive, etc. When the instructions are executed, the processor 1202 carries out the operations and functions specified in the instructions so as to operate as a special-purpose processor that implements the described process(es). Such a processor may be referred to as a "processor circuit" or "processor circuitry" in some examples.

It will be appreciated that the decoder and/or encoder according to the present application may be implemented in a number of computing devices, including, without limitation, servers, suitably-programmed general purpose computers, machine vision systems, and mobile devices. The decoder or encoder may be implemented by way of software containing instructions for configuring a processor or processors to carry out the functions described herein. The software instructions may be stored on any suitable non-transitory computer-readable memory, including CDs, RAM, ROM, Flash memory, etc.

It will be understood that the decoder and/or encoder described herein and the module, routine, process, thread, or other software component implementing the described method/process for configuring the encoder or decoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

The present application also provides for a computer-readable signal encoding the data produced through application of an encoding process in accordance with the present application.

Certain adaptations and modifications of the described embodiments can be made. Therefore, the above discussed embodiments are considered to be illustrative and not restrictive.

What is claimed is:

1. A method of encoding a point cloud to generate a bitstream of compressed point cloud data, the point cloud being defined in a tree structure having a plurality of nodes having parent-child relationships and that represent the geometry of a volumetric space recursively split into sub-volumes and containing the points of the point cloud, the method comprising:
coding an occupancy pattern for a current node associated with a volume split into sub-volumes, wherein the occupancy pattern indicates occupancy of the sub-volumes, by
selecting a probability distribution from among a plurality of probability distributions, wherein the selecting is based on neighbour configuration indicating occupancy status of volumes neighbouring the volume;
entropy encoding the occupancy pattern based on the selected probability distribution to produce encoded data for the bitstream; and
updating the selected probability distribution based on the occupancy pattern.

2. The method claimed in claim 1, wherein the volumes neighbouring the volume are volumes sharing a face with the volume.

3. The method claimed in claim 2, wherein the neighbour configuration is a binary string in which each bit indicates the occupancy of a respective one of the volumes neighbouring the volume.

4. The method claimed in claim 2, wherein the neighbour configuration indicates the occupancy status of the volumes neighbouring the volume in an ordered pattern.

5. The method claimed in claim 2, wherein there are eight volumes neighbouring the volume, and the neighbour configuration is one of 64 possible occupancy patterns.

6. The method claimed in claim 2, wherein there are eight volumes neighbouring the volume, and the neighbour configuration is based on one of 64 possible occupancy patterns for the eight volumes neighbouring the volume.

7. The method claimed in claim 6, wherein two or more of the occupancy patterns are mapped to the same probability distribution.

8. The method claimed in claim 7, wherein two or more horizontally oriented occupancy patterns are mapped to a first probability distribution and two or more vertically oriented occupancy patterns are mapped to a second probability distribution.

9. The method claimed in claim 8, wherein the 64 possible occupancy patterns are mapped to 18 or fewer probability distributions.

10. An encoder for encoding a point cloud to generate a bitstream of compressed point cloud data, the point cloud being defined in a tree structure having a plurality of nodes having parent-child relationships and that represent the geometry of a volumetric space recursively split into sub-volumes and containing the points of the point cloud, the encoder comprising:
a processor;
memory; and
an encoding application containing instructions executable by the processor that, when executed, cause the processor to code an occupancy pattern for a current node associated with a volume split into sub-volumes, wherein the occupancy pattern indicates occupancy of the sub-volumes, by:
selecting a probability distribution from among a plurality of probability distributions, wherein the selecting is based on neighbour configuration indicating occupancy status of volumes neighbouring the volume;
entropy encoding the occupancy pattern based on the selected probability distribution to produce encoded data for the bitstream; and
updating the selected probability distribution based on the occupancy pattern.

11. A method of decoding a bitstream of compressed point cloud data to produce a reconstructed point cloud, the point cloud being defined in a tree structure having a plurality of nodes having parent-child relationships and that represent the geometry of a volumetric space recursively split into sub-volumes and containing the points of the point cloud, the method comprising:

decoding an occupancy pattern for a current node associated with a volume split into sub-volumes, wherein the occupancy pattern indicates occupancy of the sub-volumes, by:
  selecting a probability distribution from among a plurality of probability distributions, wherein the selecting is based on neighbour configuration indicating occupancy status of volumes neighbouring the volume;
  entropy decoding the occupancy pattern from the bitstream based on the selected probability distribution to produce a reconstructed occupancy pattern; and
  updating the selected probability distribution based on the reconstructed occupancy pattern.

12. The method claimed in claim 11, wherein the volumes neighbouring the volume are volumes sharing a face with the volume.

13. The method claimed in claim 12, wherein the neighbour configuration is a binary string in which each bit indicates the occupancy of a respective one of the volumes neighbouring the volume.

14. The method claimed in claim 12, wherein the neighbour configuration indicates the occupancy status of the volumes neighbouring the volume in an ordered pattern.

15. The method claimed in claim 12, wherein there are eight volumes neighbouring the volume, and the neighbour configuration is one of 64 possible occupancy patterns.

16. The method claimed in claim 12, wherein there are eight volumes neighbouring the volume, and the neighbour configuration is based on one of 64 possible occupancy patterns for the eight volumes neighbouring the volume.

17. The method claimed in claim 16, wherein two or more of the occupancy patterns are mapped to the same probability distribution.

18. The method claimed in claim 17, wherein two or more horizontally oriented occupancy patterns are mapped to a first probability distribution and two or more vertically oriented occupancy patterns are mapped to a second probability distribution.

19. The method claimed in claim 18, wherein the 64 possible occupancy patterns are mapped to 18 or fewer probability distributions.

20. A decoder for decoding a bitstream of compressed point cloud data to produce a reconstructed point cloud, the point cloud being defined in a tree structure having a plurality of nodes having parent-child relationships and that represent the geometry of a volumetric space recursively split into sub-volumes and containing the points of the point cloud, the decoder comprising:
  a processor;
  memory; and
  a decoding application containing instructions executable by the processor that, when executed, cause the processor to decode an occupancy pattern for a current node associated with a volume split into sub-volumes, wherein the occupancy pattern indicates occupancy of the sub-volumes, by:
  selecting a probability distribution from among a plurality of probability distributions, wherein the selecting is based on neighbour configuration indicating occupancy status of volumes neighbouring the volume;
  entropy decoding the occupancy pattern from the bitstream based on the selected probability distribution to produce a reconstructed occupancy pattern; and
  updating the selected probability distribution based on the reconstructed occupancy pattern.

* * * * *